US012622068B2

(12) United States Patent
Deng et al.

(10) Patent No.:  US 12,622,068 B2
(45) Date of Patent:       May 5, 2026

(54) SOLAR CELL AND PREPARATION METHOD THEREFOR

(71) Applicant: TONGWEI SOLAR (MEISHAN) CO., LTD., Meishan (CN)

(72) Inventors: Mingzhang Deng, Meishan (CN); Wenzhou Xu, Meishan (CN); Yu He, Meishan (CN); Hao Chen, Meishan (CN); Fan Zhou, Meishan (CN); Xiajie Meng, Meishan (CN); Pengyu Zhou, Meishan (CN); Qian Yao, Meishan (CN); Guoqiang Xing, Meishan (CN)

(73) Assignee: TONGWEI SOLAR (MEISHAN) CO., LTD., Meishan (CN)

( * ) Notice: Subject to any disclaimer, the term of this patent is extended or adjusted under 35 U.S.C. 154(b) by 285 days.

(21) Appl. No.: 18/553,369

(22) PCT Filed: May 30, 2022

(86) PCT No.: PCT/CN2022/096065
§ 371 (c)(1),
(2) Date: Sep. 29, 2023

(87) PCT Pub. No.: WO2023/071183
PCT Pub. Date: May 4, 2023

(65) Prior Publication Data
US 2024/0186439 A1       Jun. 6, 2024

(30) Foreign Application Priority Data
Oct. 27, 2021    (CN) .......................... 202111256035.8

(51) Int. Cl.
H10F 10/14           (2025.01)
H10F 10/174          (2025.01)
(Continued)

(52) U.S. Cl.
CPC ......... H10F 10/146 (2025.01); H10F 10/174 (2025.01); H10F 71/1221 (2025.01);
(Continued)

(58) Field of Classification Search
CPC .... H10F 10/146; H10F 10/174; H10F 77/219; H10F 77/277; H10F 77/315;
(Continued)

(56) References Cited

U.S. PATENT DOCUMENTS

| 2014/0158193 A1 | 6/2014 | Desphande et al. |
| 2019/0097078 A1 | 3/2019 | Geerligs et al. |

(Continued)

FOREIGN PATENT DOCUMENTS

| CN | 103618025 | 3/2014 | |
| CN | 106024983 A | * 10/2016 | ........... H10F 10/146 |

(Continued)

OTHER PUBLICATIONS

Machine translation of WO-2012081813-A1, Lee, Joon Sung. (Year: 2012).*

(Continued)

*Primary Examiner* — Mayla Gonzalez Ramos
(74) *Attorney, Agent, or Firm* — Dority & Manning, PA

(57) ABSTRACT

In a solar cell, the back surface of a substrate thereof is provided with alternately distributed emitter zones and back surface field zones. An emitter is formed in each emitter zone, and the emitters are made of boron-doped monocrystalline silicon. A back surface field is formed in each back surface field zone; the back surface fields comprise tunneling oxide layers and polycrystalline silicon layers in stacked distribution, the polycrystalline silicon layers being made of phosphorus-doped polycrystalline silicon, and the tunneling oxide layers being located between a polycrystalline silicon layer and a polycrystalline silicon layer. Positive electrodes (Continued)

are electrically connected to the emitters, and negative electrodes are electrically connected to the back surface fields. In the described solar cell, the light-receiving area of the front surface can be expanded and the recombination rate of electron-hole pairs can be reduced, thereby effectively improving the photoelectric conversion efficiency of the solar cell.

18 Claims, 3 Drawing Sheets

(51) Int. Cl.

| | | |
|---|---|---|
| *H10F 71/00* | (2025.01) | |
| *H10F 77/00* | (2025.01) | |
| *H10F 77/1223* | (2025.01) | |
| *H10F 77/164* | (2025.01) | |
| *H10F 77/20* | (2025.01) | |
| *H10F 77/30* | (2025.01) | |

(52) U.S. Cl.
CPC ..... *H10F 77/1223* (2025.01); *H10F 77/1642* (2025.01); *H10F 77/227* (2025.01); *H10F 77/315* (2025.01); *H10F 77/937* (2025.01)

(58) Field of Classification Search
CPC .............. H10F 77/937; H10F 77/1223; H10F 77/1642; H10F 71/1221
See application file for complete search history.

(56) References Cited

U.S. PATENT DOCUMENTS

| | | | | |
|---|---|---|---|---|
| 2021/0175374 A1* | 6/2021 | Kim | ..................... | H10F 77/315 |
| 2024/0379894 A1* | 11/2024 | Heilig | ................... | H10F 71/129 |

FOREIGN PATENT DOCUMENTS

| | | | | | |
|---|---|---|---|---|---|
| CN | 106876501 | A | 6/2017 | | |
| CN | 108110065 | A | 6/2018 | | |
| CN | 108336154 | A | 7/2018 | | |
| CN | 108666377 | | 10/2018 | | |
| CN | 109244194 | A * | 1/2019 | .......... | H10F 77/219 |
| CN | 110634964 | A | 12/2019 | | |
| CN | 110838536 | | 2/2020 | | |
| CN | 111564503 | | 8/2020 | | |
| CN | 111564503 | A * | 8/2020 | .......... | H10F 71/121 |
| CN | 112599615 | A | 4/2021 | | |
| CN | 112864275 | A | 5/2021 | | |
| CN | 113299769 | A | 8/2021 | | |
| CN | 113299772 | A | 8/2021 | | |
| CN | 113345970 | A | 9/2021 | | |
| CN | 113990961 | | 1/2022 | | |
| WO | WO-2012081813 | A1 * | 6/2012 | .......... | H10F 10/146 |
| WO | WO2015071217 | | 5/2015 | | |

OTHER PUBLICATIONS

Machine translation of CN-106024983-A, Liu, Chao. (Year: 2016).*
Machine translation of CN-109244194-A, Yuan, Sheng-zhao. (Year: 2019).*
Machine translation of CN-111564503-A, Hu, Lin-na. (Year: 2020).*
Extended European Search Report for corresponding Application No. 22885093.9, dated Apr. 19, 2024, 11 pages.
Chinese Search Report (w/ English translation) for corresponding Application No. 2021112560358, dated May 29, 2023, 5 pages.
Supplementary Chinese Search Report for corresponding Application No. 2021112560358, dated Aug. 15, 2023, 2 pages.
Chinese Office Action for corresponding Chinese Application No. CN 202111256035.8, dated May 31, 2023, 5 pages.
PCT International Search Report and Written Opinion (with English translation) for corresponding PCT Application No. PCT/CN2022/096065, mailed Jun. 29, 2022, 14 pages.

* cited by examiner

SOLAR CELL AND PREPARATION METHOD THEREFOR

CROSS-REFERENCE TO RELATED APPLICATIONS

This application is the national phase under U.S.C. § 371 of PCT International Application No. PCT/CN2022/096065, which has an international filing date of May 30, 2022 and claims priority of Chinese patent application No. 202111256035.8, entitled "Solar cell and preparation method therefor" and filed before the China National Intellectual Property Administration on Oct. 27, 2021. The entireties of both applications are incorporated by reference herein for all purposes.

TECHNICAL FIELD

The present application relates to the field of photovoltaic technology, and specifically to a solar cell and a preparation method thereof.

BACKGROUND

The frontal light receiving area of a solar cell is an important factor affecting its photoelectric conversion efficiency. However, there is a grid line structure covered on a front side of a conventional solar cell, that causes a loss of current and therefore leads to a decreasing of the photoelectric conversion efficiency.

In addition, for a crystalline silicon solar cell, the photoelectric conversion efficiency of the solar cell is determined by the recombination of electron-hole pairs inside the cell; however, for a diffusion layer formed by conventional diffusion, there are problems such as large recombination rate of electron-hole pairs, which has been one of important factors limiting the solar cell efficiency.

SUMMARY

The present application provides a solar cell and the preparation method thereof, which can increase the frontal light receiving area and decrease the recombination rate of electron-hole pairs, thus can effectively improve the photoelectric conversion efficiency of the solar cell.

Embodiments of the present application are implemented in such a way that:

Some embodiments of the present application provide a solar cell with a substrate having alternating emitter regions and back surface field regions on the back of the substrate.

Emitters are formed in the emitter regions, and the emitters are made of boron doped monocrystalline silicon.

Back surface fields are formed in the back surface field regions. The back surface field includes a tunnel oxide layer and a polysilicon layer laminated arranged. The polysilicon layer is made of phosphorus doped polysilicon, and the tunnel oxide layer is located between the polysilicon layer and the polysilicon layer.

A positive electrode of the solar cell is electrically connected to the emitter and a negative electrode of the solar cell is electrically connected to the back surface field.

In the above technical solution, the emitter connected to the positive electrode is disposed at the back of the substrate, so that there is no positive electrode and corresponding grid line structure on the front side of the substrate, which can increase the light receiving area on the front side and reduce the current loss caused by shading on the front side of the substrate, thus increasing the photoelectric conversion efficiency of the solar cell.

A tunnel oxide layer and a polysilicon layer made of phosphorus doped polysilicon are provided on the back side of the substrate to act as a back surface field. The tunneling effect of the tunnel oxide layer allows electrons to pass through but not holes, and the phosphorus doped polysilicon forms a passivated contact, thus reducing the recombination rate of electron-hole pairs.

In some optional embodiments, the emitter region and the back surface field region may be distributed side by side along a first predetermined direction.

In the first predetermined direction, each back surface field region may have a dimension of 100 to 300 μm and the spacing between two adjacent back surface field regions may be 600 to 1500 μm.

In the above technical solution, the emitter region and the back surface field region have suitable dimension and spacing, which enables the solar cell to have a suitable grid line density and facilitates the printing operation in the preparation process; while ensuring metal contact, it can also effectively achieve the purpose of reducing the emitter recombination, increasing the open circuit voltage of the cell and improving the photoelectric conversion efficiency of the cell.

In some optional embodiments, the positive electrode may have a dimension of 50 to 200 μm and the negative electrode may have a dimension of 40 to 100 μm in the first predetermined direction.

Optionally, the positive electrode may be electrically connected to the inner wall of a emitter contact hole provided in the emitter, and the negative electrode may be electrically connected to the inner wall of a back surface field contact hole provided in the back surface field; each of the emitter contact hole and the back surface field contact hole may have a diameter of 25 to 50 μm.

Optionally, in the first predetermined direction, the spacing between centers of two adjacent emitter contact holes in each emitter may be of 20 to 80 μm, and spacing between centers of two adjacent back surface field contact holes in each back surface may be of 20 to 80 μm.

Optionally, each emitter region and each back surface field region may extend along a second predetermined direction; the second predetermined direction may be perpendicular to the first predetermined direction. In the second predetermined direction, the spacing between centers of two adjacent emitter contact holes in each emitter may be of 50 to 100 μm, and the spacing between centers of two adjacent back surface field contact holes in each back surface may be of 20 to 80 μm.

Optionally, the emitter and the back surface field may be interleaved such that the emitter contact holes and the back surface field contact holes are interleaved.

Optionally, in each emitter region, the emitter contact holes may be provided in at least one row, wherein a plurality of emitter contact holes in each row of emitter contact holes are spaced along a second predetermined direction, and multiple rows of emitter contact holes are spaced along a first predetermined direction. In each back surface field region, the back surface field contact holes may be provided in at least one row, wherein a plurality of back surface field contact holes in each row of back surface field contact holes are spaced along a second predetermined direction, and multiple rows of back surface field contact holes are spaced along a first predetermined direction.

In the above-mentioned technical solution, the electrodes and contact holes have suitable specifications and spacings, are well matched to the emitters and back surface fields, and can effectively control the metallized area of the solar cell, while facilitating the printing operation during the preparation process.

In some optional embodiments, the tunnel oxide layer may be a silica film and may have a thickness of 1 to 5 nm; and optionally, the tunnel oxide layer may have a thickness of 1 to 3 nm.

And/or, the thickness of the polysilicon layer may be from 100 nm to 500 nm.

In some optional embodiments, the solar cell may further include a silicon nitride anti-reflection layer, an aluminum oxide passivation layer and a silicon nitride passivation layer.

The silicon nitride anti-reflection layer can be formed on the surface of the anti-reflection textured structure on the front side of the substrate.

The aluminum oxide passivation layers can be formed on the surfaces of the emitters and the back surface fields.

The silicon nitride passivation layer can be formed on the surface of the aluminum oxide passivation layer.

After passing through the silicon nitride passivation layer and the aluminum oxide passivation layer, the positive electrode is electrically connected to the emitter. And after passing through the silicon nitride passivation layer and the aluminum oxide passivation layer, the negative electrode is electrically connected to the back surface field.

Optionally, the thickness of the silicon nitride anti-reflection layer may be 80 to 120 nm.

Optionally, the thickness of the aluminum oxide passivation layer may be 3 to 20 nm.

Optionally, the thickness of the silicon nitride passivation layer may be 75 to 150 nm.

Optionally, a front surface field may also be formed on the surface of the anti-reflection textured structure by shallow phosphorus diffusion. The front surface field is located between the anti-reflection textured structure and the silicon nitride anti-reflection layer.

In the above technical solution, the solar cell has suitable structural layers and each structural layer has a suitable thickness, which helps to ensure the photoelectric conversion efficiency of the solar cell.

In some optional embodiments, the solar cell may further include a positive electrode bus bar and a negative electrode bus bar spaced apart.

The positive electrode bus bar can be electrically connected to each positive electrode and the negative electrode bus bar can be electrically connected to each negative electrode. The positive electrode bus bar is spaced from the negative electrode with insulating adhesive and the negative electrode bus bar is spaced from the positive electrode with insulating adhesive.

Optionally, each of the positive electrodes and the negative electrodes may extend in a third predetermined direction, the positive electrode bus bar and the negative electrode bus bar extending in a direction perpendicular to the direction of extension of the positive electrode and the negative electrode bus bar extending in a direction perpendicular to the direction of extension of the negative electrode.

In the above technical solution, the convergence of multiple electrodes can be easily carried out by means of a bus bar; the insulating adhesive is set to effectively avoid short-circuiting of the positive and negative electrodes and is easy to prepare.

Other embodiments of the present application provide a method of preparing a solar cell, which may comprise:

conducting a boron diffusion on a substrate to form a boron diffusion layer on a surface of the substrate and a borosilicate glass on a surface of the boron diffusion layer;

using a first surface of the substrate as a back of the substrate, and sequentially conducting laser slotting and boron diffusion layer etching on partial area of the borosilicate glass on the back of the substrate to form back surface field regions, areas without being slotted and etched being emitter regions, and the emitter regions and the back surface field regions being configured to alternate on the back of the substrate;

growing a tunnel oxide layer on the back of the substrate, followed by depositing an intrinsic amorphous silicon layer;

conducting a phosphorus diffusion on the substrate, so as to cause the intrinsic amorphous silicon layer to form a polysilicon layer made of phosphorus doped polysilicon and create a phosphosilicate glass on the surface of the polysilicon layer;

printing a corrosion resistant slurry on a surface of the phosphosilicate glass corresponding to the back surface field regions and drying the corrosion resistant slurry to form an alkali-soluble but acid-insoluble layer, the corrosion resistant slurry being soluble in alkali but insoluble in acid;

removing the phosphosilicate glass corresponding to the emitter regions with acid;

removing the alkali-soluble but acid-insoluble layer and the polysilicon layer and the tunnel oxide layer corresponding to the emitter regions with alkali;

removing the remaining phosphorosilicate glass and borosilicate glass on the back of the substrate with acid;

using the remaining boron diffusion layer in the emitter regions as emitters, and using the remaining tunnel oxide layer and polysilicon layer in the back surface field regions as back surface fields; and electrically connecting a positive electrode to the emitter and electrically connecting a negative electrode to the back surface field.

In the above technical solution, the formation of borosilicate glass (BSG) and phosphorsilicate glass (PSG) as masks by diffusion, together with partial area laser slotting and etching and paste printing, enables the formation of solar cell structures such as those provided in some of the above embodiments, which can increase the frontal light receiving area and reduce the recombination rate of electron-hole pairs, thereby effectively increasing the photoelectric conversion efficiency of the solar cell.

In some optional embodiments, the step of removing the alkali-soluble but acid-insoluble layer and the polysilicon layer and the tunnel oxide layer corresponding to the emitter region with alkali may comprise:

Removing the alkali-soluble but acid-insoluble layer with a first alkali liquor, followed by removing the polysilicon layer and the tunnel oxide layer corresponding to the emitter region with a second alkali liquor.

Wherein, the alkalinity of the first alkali liquor is less than that of the second alkali liquor.

In the above technical solution, the removal of alkali-soluble but acid-insoluble layer is carried out in separate steps from the removal of the polysilicon layer and tunnel oxide layer, which facilitates the treatment in separate tanks and can effectively improve the situation of tank cross contamination.

The use of a second alkali liquor with a relatively large alkalinity facilitates a more adequate removal of the polysilicon layer and tunnel oxide layer corresponding to the emitter region.

In some optional embodiments, the step of electrically connecting the positive electrode to the emitter and electrically connecting the negative electrode to the back surface field may comprise:

Providing an emitter contact hole in the emitter and printing a positive electrode on an area corresponding to the emitter contact hole; and Providing a back surface field contact hole in the back surface field and printing a negative electrode on the area corresponding to the back surface field contact hole.

In the above technical solution, the electrodes are prepared by printing metal slurry after providing the holes, which helps to reduce the metallized area, thus reducing metal complexing on the back of the cell and increasing the photoelectric conversion efficiency.

In some optional embodiments, the step of using the second surface of the substrate as the front surface of the substrate and forming an anti-reflection textured structure on the surface of the substrate may comprise:

After the step of removing the alkali-soluble but acid-insoluble layer and the polysilicon layer and the tunnel oxide layer corresponding to the emitter region with alkali, and before the step of removing the remaining phosphorosilicate glass and borosilicate glass on the back of the substrate with acid, removing the phosphorosilicate glass and borosilicate glass on the front surface of the substrate with acid, and then texturing the front surface of the substrate to form an anti-reflection textured structure.

In the above technical solution, the texturing step is carried out after the N-type and P-type areas have been prepared, which effectively reduces the damage to the anti-reflection textured structure from the previous processes. Also, the texturing step is carried out before the removal of the remaining phosphorosilicate glass and borosilicate glass on the back of the substrate, so that the remaining phosphorosilicate glass and borosilicate glass on the back of the substrate can be served as a mask, effectively preventing damage to the N-type and P-type areas from the texturing step.

BRIEF DESCRIPTION OF THE DRAWINGS

In order to illustrate more clearly the technical solutions of the embodiments of the present application, a brief description of the accompanying drawings to be used in the embodiments is given below. It should be understood that the following accompanying drawings only illustrate certain embodiments of the present application and should therefore not be regarded as limiting the scope, and for a person of ordinary skill in the art, other relevant accompanying drawings may be obtained on the basis of these drawings without paying any creative effort.

REFERENCE SIGNS

Figure 1:
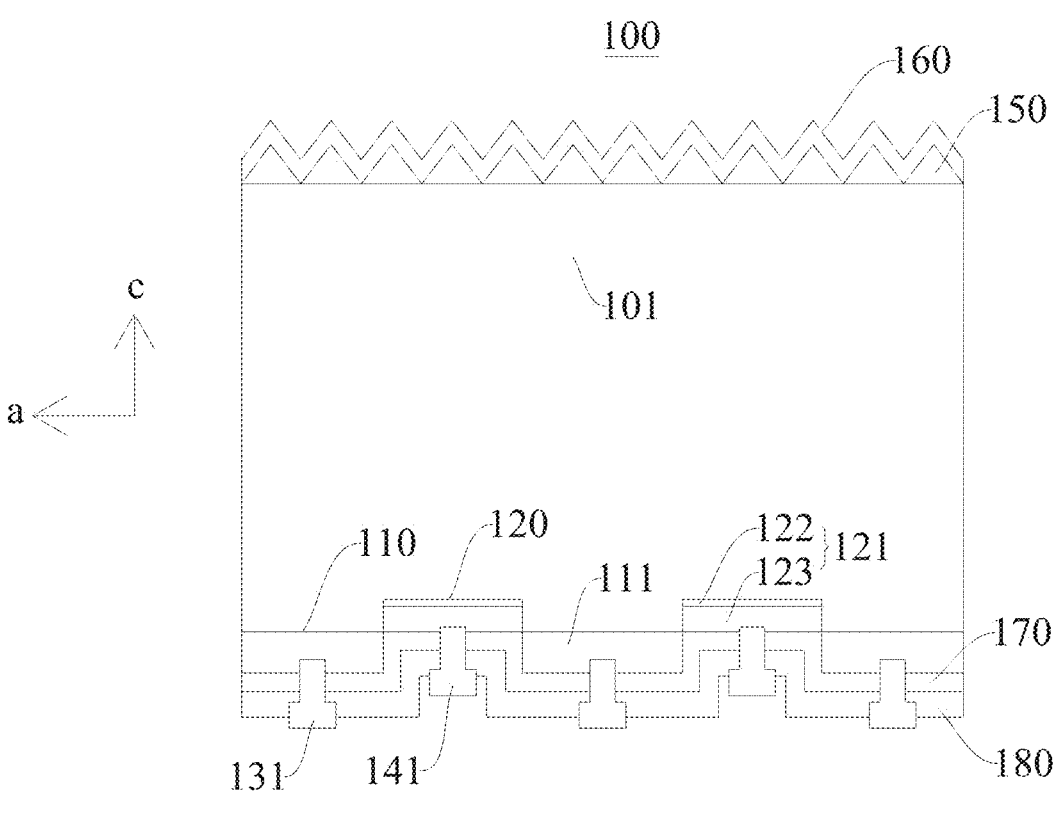
FIG. 1 illustrates a structural schematic diagram of a first type of solar cell provided by an embodiment of the present application.

100—solar cell; 101—substrate; 110—emitter region; 111—emitter; 120—back surface field region; 121—back surface field; 122—tunnel oxide layer; 123—polysilicon layer; 131—positive electrode; 132—emitter contact hole; 133—positive electrode bus bar; 141—negative electrode; 142—back surface field contact hole; 143—negative electrode bus bar; 150—anti-reflection textured structure; 160—silicon nitride anti-reflection layer; 170—aluminum oxide passivation layer; 180—silicon nitride passivation layer; 190—front surface field; 200—light spot; 300—laser slotted region; a—first predetermined direction; b—second predetermined direction; c—third predetermined direction.

DETAILED DESCRIPTION OF THE EMBODIMENTS

In order to make the purpose, technical solutions and advantages of the embodiments of the present application clearer, a clear and complete description of the technical solutions in the embodiments of the present application will be given below in conjunction with the accompanying drawings in the embodiments of the present application, it being obvious that the embodiments described are a part of the embodiments of the present application and not all of them. In general, the assemblies of the embodiments of the present application described and illustrated in the accompanying drawings herein can be arranged and designed in a variety of different configurations.

Accordingly, the following detailed description of the embodiments of the present application provided in the accompanying drawings is not intended to limit the scope of the present application for which protection is claimed, but merely to indicate selected embodiments of the present application. Based on the embodiments in this application, all other embodiments obtained without creative labor by a person of ordinary skill in the art fall within the scope of protection of the present application.

It should be noted that similar reference signs and letters indicate similar items in the accompanying drawings below, so that once an item has been defined in one accompanying drawing, it does not need to be further defined and explained in subsequent drawings.

In the description of the present application, it should be noted that the terms "front", "back", "center", "inside", "outside", etc., indicate an orientation or positional relationship based on the orientation or positional relationship shown in the attached drawings, or the orientation or positional relationship in which the product of the application is customarily placed in use, only for the purpose of describing the application and simplifying the description, and do not indicate or imply that the device or element referred to must have a particular orientation, or be constructed or operate in a particular orientation; therefore, it is not to be construed as limiting the present application.

Furthermore, the terms "first", "second", etc., are used only to distinguish between descriptions and are not to be understood as indicating or implying relative importance.

In addition, the terms "perpendicular to", "parallel with" and the like do not mean that the components are required to be absolutely perpendicular to or parallel with, but can be slightly angled.

In the embodiments of this application, where no specific conditions are indicated, they are carried out under conventional conditions or those recommended by the manufacturer. Where no manufacturer is indicated, the reagents or instruments used are conventional products that can be obtained through commercially available purchases.

In addition, it should be noted that "and/or" in this application, such as "feature 1 and/or feature 2", refers to "feature 1" alone, "feature 2" alone, and "feature 1" plus "feature 2", including three situations.

The structures and methods of the embodiments of the present application are described in detail below.

Referring to FIG. 1, in a first aspect, an embodiment of the present application provides a solar cell 100 having a substrate 101 with alternating arranged emitter regions 110 and back surface field regions 120 on the back of the substrate 101.

In order to facilitate a clearer presentation of the technical solutions of this application, the following definitions are given.

Figure 2:
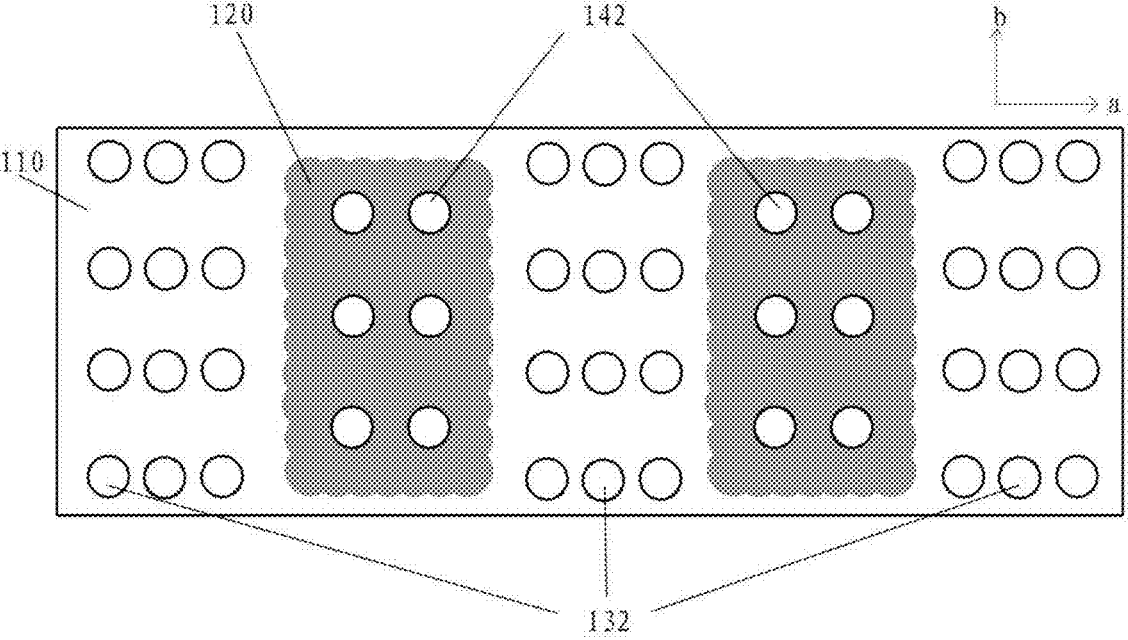
FIG. 2 illustrates a schematic diagram showing the partitioned and slotted structure on the back of the solar cell provided in an embodiment of the present application.

Referring to FIGS. 1 and 2, the emitter regions 110 and the back surface field regions 120 are alternately distributed side by side in a first predetermined direction a, and each of the emitter regions 110 and back surface field regions 120 extends in a second predetermined direction b; the first predetermined direction a and the second predetermined direction b are perpendicular to each other, and both of them are parallel to a surface of the substrate 101. The solar cell 100 has a thickness direction in a third predetermined direction c, which is perpendicular to the surface of the substrate 101.

The emitter region 110 is provided with an emitter 111, which is made of boron doped monocrystalline silicon. The back surface field region 120 is provided with a back surface field 121. The back surface field 121 includes a tunnel oxide layer 122 and a polysilicon layer 123 laminated arranged. The material of the polysilicon layer 123 is phosphorus-doped polysilicon, and the tunnel oxide layer 122 is located between a polysilicon layer 123 and another polysilicon layer 123. The positive electrode 131 of the solar cell 100 is electrically connected to the emitter 111, and the negative electrode 141 of the solar cell 100 is electrically connected to the back surface field 121.

In the solar cell 100 provided in the present application, the emitter 111 to be connected to the positive electrode 131 may be provided on the back of the substrate 101, so that there is NO positive electrode 131 and the corresponding grid line structure on the front surface of the substrate 101, which can increase the frontal light receiving area and reduce the current loss caused by the shading on the front surface of the substrate 101, thus the photoelectric conversion efficiency of the solar cell can be improved. The tunnel oxide layer 122 and the polysilicon layer 123 made of phosphorus-doped polysilicon are provided on the back of the substrate 101 as the back surface field 121. The tunneling effect of the tunnel oxide layer 122 allows electrons to pass through but not holes, and the phosphorus-doped polysilicon forms a passivated contact, thus reducing the recombination rate of electron-hole pairs.

In some exemplary embodiments, in the first predetermined direction a, each back surface field region 120 may have a dimension of 100 to 300 μm, for example, but not limited to, any one of or in a range between any two of 100 μm, 150 μm, 200 μm, 250 μm and 300 μm, such that the back surface field region 120 has a suitable dimension and such that adjacent two emitter regions 110 have a suitable spacing therebetween.

Optionally, the spacing between two adjacent back surface field regions 120 may be from 600 μm to 1500 μm, for example, but not limited to, any one of or in a range between any two of 600 μm, 700 μm, 800 μm, 900 μm, 1000 μm, 1100 μm, 1200 μm, 1300 μm, 1400 μm and 1500 μm, such that the emitter region 110 has a suitable dimension and such that two adjacent back surface field regions 120 have a suitable spacing therebetween.

The above mentioned arrangements, by reasonably configuring the dimension and spacing of the emitter regions 110 and the back surface field regions 120, make the solar cell 100 have a suitable grid line density, which facilitates the printing operation in the preparation process; while ensuring metal contact, it can also effectively achieve the purpose of reducing the complexing of the emitter 111, increasing the open circuit voltage of the cell and improving the photoelectric conversion efficiency of the cell.

Optionally, in the first predetermined direction a, the positive electrode 131 may have a dimension of 50 to 200 μm, for example, but not limited to, any one of or in a range between any two of 50 μm, 80 μm, 100 μm, 120 μm, 150 μm, 180 μm and 200 μm, so that it has a better matching with the emitter 111. In the first predetermined direction a, the negative electrode 141 may have a dimension of 40 to 100 μm, for example, but not limited to, any one of or in a range between any two of 40 μm, 60 μm, 80 μm and 100 μm, so that it has a better matching with the back surface field 121.

It would be understood that in the solar cell 100 provided in the present application, the positive electrode 131 and the negative electrode 141 may be electrically connected to the emitter 111 and the back surface field 121 respectively in conventional manners, for example by printing the positive electrode 131 and the negative electrode 141 on the emitter 111 and the back surface field 121 respectively.

As an example, the emitter 111 may be provided with an emitter contact hole 132, and the positive electrode 131 may be electrically connected to the inner wall of the emitter contact hole 132 provided in the emitter 111. The back surface field 121 may be provided with a back surface field contact hole 142, and the negative electrode 141 may be electrically connected to the inner wall of the back surface field contact hole 142 provided in the back surface field 121. In the present application, as the emitters 111 and the back surface fields 121 are alternately arranged with each other, so that the emitter contact holes 132 and the back surface field contact holes 142 are alternately arranged with each other, it not only enables more effective current collection, but also enables the process personnel to identify the positive and negative electrode positions more quickly during screen printing aligning procedure.

Optionally, the diameter of both the emitter contact hole 132 and the back surface field contact hole 142 may be from 25 μm to 50 μm, for example, but not limited to, any one of or in a range between any two of 25 μm, 30 μm, 35 μm, 40 μm, 45 μm and 50 μm, to facilitate the electrodes obtained by electrode forming printing to be able to maintain a better electrical connection with the contact holes.

Considering that a suitable contact hole density allows for a suitable distribution density of the electrodes, it facilitates the printing process during preparation and also allows for effective control of the grid line density and metallized area.

Exemplarily, in each emitter region 110, the emitter contact holes 132 may be provided in at least one row, for example from 1 to 5 rows. Therein, a plurality of emitter contact holes 132 in each row of emitter contact holes 132 are spaced along a second predetermined direction b, and multiple rows of emitter contact holes 132 are spaced along a first predetermined direction a. In each back surface field region 120, the back surface field contact holes 142 may be provided in at least one row, for example from 1 to 8 rows. Therein, a plurality of back surface field contact holes 142 in each row of back surface field contact holes 142 are spaced along the second predetermined direction b, and multiple rows of back surface field contact holes 142 are spaced along the first predetermined direction a.

Optionally, in the first predetermined direction a, the spacing between centers of two adjacent emitter contact holes 132 in each emitter 111 may be from 20 μm to 80 μm, and the spacing between centers of two adjacent back surface field contact holes 142 in each back surface may be from 20 μm to 80 μm, for example, but not limited to, any one of or in a range between any two of 20 μm, 30 μm, 40 μm, 50 μm, 60 μm, 70 μm and 80 μm.

Optionally, in the second predetermined direction b, the spacing between centers of two adjacent emitter contact holes 132 in each emitter 111 is from 50 μm to 100 μm, for example, but not limited to, any one of or in a range between any two of 50 μm, 60 μm, 70 μm, 80 μm, 90 μm and 100 μm. The spacing between centers of two adjacent back surface field contact holes 142 in each back surface is from 20 μm to 80 μm, for example, but not limited to, any one of or in a range between any two of 20 μm, 30 μm, 40 μm, 50 μm, 60 μm, 70 μm and 80 μm.

Considering that both the emitter 111 and the back surface field 121 are provided with a plurality of electrodes, the use of a bus bar facilitates the connection of a plurality of electrodes.

Figures 3, 4:
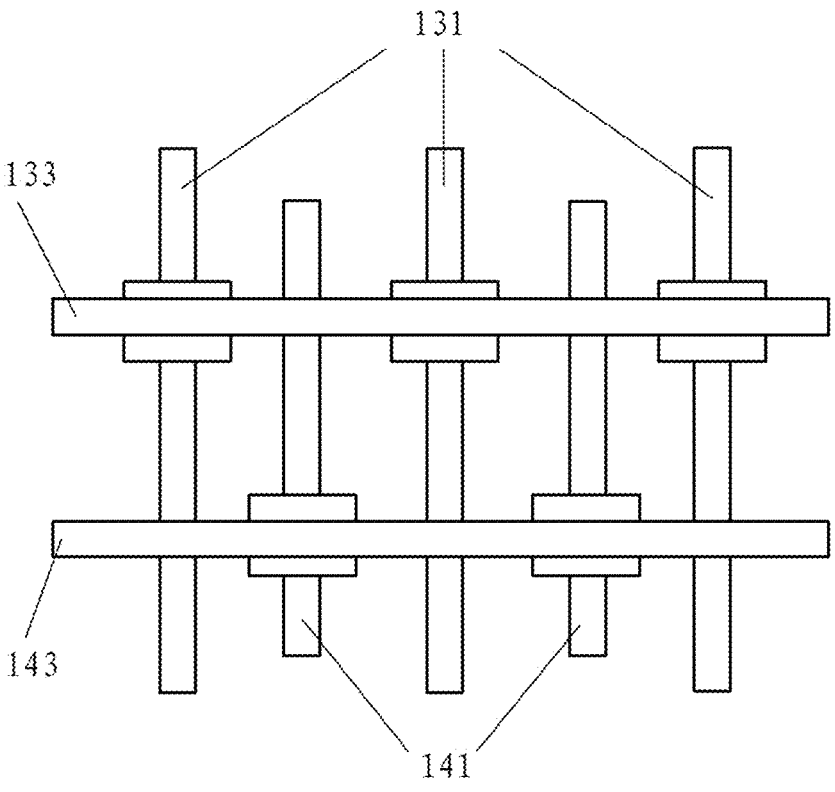
FIG. 3 illustrates a schematic diagram of the connection of electrodes of the solar cell provided in an embodiment of the present application.
FIG. 4 illustrates a structural schematic diagram of a second type of solar cell provided by an embodiment of the present application.

Referring to FIG. 3, as an example, the solar cell 100 may further comprise a positive electrode bus bar 133 and a negative electrode bus bar 143 spaced arranged. The positive electrode bus bar 133 is electrically connected to each positive electrode 131 and the negative electrode bus bar 143 is electrically connected to each negative electrode 141. The positive electrode bus bar 133 is separated from the negative electrodes 141 with an insulating adhesive (not shown) and the negative electrode bus bar 143 is also separated from the positive electrodes 131 with an insulating adhesive (not shown). The insulating adhesive is, for example, printed between the bus bars and the corresponding electrodes. The insulating adhesive effectively prevents short-circuiting of the positive and negative electrodes and is easy to prepare.

Optionally, both the positive electrodes 131 and the negative electrodes 141 may be extended in a third predetermined direction c. The positive electrode bus bar 133 and the negative electrode bus bar 143 extend in a direction perpendicular to the direction along which the positive electrodes 131 extend, and the negative electrode bus bar 143 extends in a direction perpendicular to the direction along which the negative electrodes 141 extend, to ensure that the bus bar can be more easily connected to multiple electrodes.

It is to be understood that additional functional layers can be added to the solar cell 100 provided in the present application in a manner that is well known in the art. In addition, the requirements regarding the material and thickness of each functional layer can be set according to design needs or criteria that are well known in the art.

In some exemplary embodiments, the solar cell 100 may further comprise a silicon nitride anti-reflection layer 160, an aluminum oxide passivation layer 170 and a silicon nitride passivation layer 180. The silicon nitride anti-reflection layer 160 is formed on a surface of an anti-reflection textured structure 150 on the front surface of the substrate 101. The aluminum oxide passivation layer 170 is formed on a surface of the emitter 111 and the back surface field 121. The silicon nitride passivation layer 180 is formed on a surface of the aluminum oxide passivation layer 170. The positive electrode 131 is electrically connected to the emitter 111 after penetrating the silicon nitride passivation layer 180 and the aluminum oxide passivation layer 170, and the negative electrode 141 is electrically connected to the emitter 111 after penetrating the silicon nitride passivation layer 180 and the aluminum oxide passivation layer 170.

Examples of the thickness and material of each functional layer are given below.

The substrate 101 may be an N-type square monocrystalline silicon wafer.

The tunnel oxide layer 122 is a silica film having a thickness of 1 to 5 nm, for example, but not limited to, any one of or in a range between any two of 1 nm, 2 nm, 3 nm, 4 nm and 5 nm.

The thickness of the polysilicon layer 123 is in the range of 100 nm to 500 nm, for example, but not limited to, any one of or in a range between any two of 100 nm, 200 nm, 300 nm, 400 nm and 500 nm.

The silicon nitride anti-reflection layer 160 is made of SiNx and has a thickness of 80 to 120 nm, for example, but not limited to, any one of or in a range between any two of 80 nm, 90 nm, 100 nm, 110 nm and 120 nm.

The aluminum oxide passivation layer 170 is made of AlOx and has a thickness of 3 to 20 nm, for example, but not limited to, any one of or in a range between any two of 3 nm, 5 nm, 8 nm, 10 nm, 13 nm, 15 nm, 18 nm and 20 nm.

The silicon nitride passivation layer 180 is made of SiNx and has a thickness of 75 to 150 nm, for example, but not limited to, any one of or in a range between any two of 75 nm, 80 nm, 90 nm, 100 nm, 110 nm, 120 nm, 130 nm, 140 nm and 150 nm.

In the above technical solution, the solar cell 100 has suitable structural layers and each structural layer has a suitable thickness, which is conducive to ensuring the photoelectric conversion efficiency of the solar cell 100.

Referring to FIG. 4, in some optional embodiments, a front surface field (FSF) 190 may further be formed on the surface of the anti-reflection textured structure 150 by shallow phosphorus diffusion. The front surface field 190 is located between the anti-reflection textured structure 150 and the silicon nitride anti-reflection layer 160. The front surface field 190 creates a minority carrier potential energy difference at the front surface, blocking the movement of minority carriers towards the high recombination surface and thus reducing the recombination of electron-hole pairs on the front surface.

In a second aspect, an embodiment of the present application provides a method of preparing a solar cell 100, which may comprise:

Conducting a boron diffusion on the substrate 101 to form a boron diffusion layer on a surface of the substrate 101 and a borosilicate glass on a surface of the boron diffusion layer;

Using a first surface of the substrate 101 as a back of the substrate 101, and sequentially conducting laser slotting and boron diffusion layer etching on partial area of the borosilicate glass on the back of the substrate 101 to form a back surface field region 120, an area without being slotted and etched being an emitter region 110, and the emitter regions 110 and the back surface field regions 120 being configured to alternate on the back of the substrate 101;

Growing a tunnel oxide layer 122 on the back of the substrate 101, followed by depositing an intrinsic amorphous silicon layer;

Conducting phosphorus diffusion on the substrate 101, so as to cause the intrinsic amorphous silicon layer to form a polysilicon layer 123 made of phosphorus-doped polysilicon and create a phosphosilicate glass on the surface of the polysilicon layer 123;

Printing a corrosion resistant slurry on a surface of the phosphosilicate glass corresponding to the back surface field region 120 and drying the corrosion resistant slurry to form an alkali-soluble but acid-insoluble layer, the corrosion resistant slurry being soluble in alkali but insoluble in acid;

Removing the phosphosilicate glass corresponding to the emitter region 110 with acid;

Removing the alkali-soluble but acid-insoluble layer and the polysilicon layer 123 and the tunnel oxide layer 122 corresponding to the emitter region 110 with alkali;

Removing the remaining phosphorosilicate glass and borosilicate glass on the back of the substrate 101 with acid;

Using the remaining boron diffusion layer in the emitter region 110 as the emitter, and using the remaining tunnel oxide layer 122 and polysilicon layer 123 in the back surface field region 120 as the back surface field 121; and Electrically connecting the positive electrode 131 to the emitter 111 and electrically connecting the negative electrode 141 to the back surface field 121.

The present application provides a method of preparing the solar cell 100, capable of preparing a solar cell 100 as provided in the embodiment of the first aspect.

It is noted that in the present application, the emitter 111 is the remaining boron diffusion layer in the emitter region 110, and is made of boron doped monocrystalline silicon. The back surface field region 120 is the region after removal of the boron diffusion layer, therefore in order to fully remove the boron diffusion layer formed by back boron diffusion on the surface of the substrate 101, the surface field region is slotted to a depth which is greater than or equal to the boron diffusion depth in the boron diffusion step.

As an example, the tunnel oxide layer 122 grows in the back surface field region 120 at a position lower than the region where the emitter region 110 grows the emitter 111; that is, a vertical distance from a side of the tunnel oxide layer 122 proximal to the front surface of the substrate 101 to the middle of the substrate being L1 and a vertical distance from a side of the emitter 111 proximal to the front surface of the substrate 101 to the middle of the substrate being L2, L1<L2.

In some exemplary embodiments, the step of removing the alkali-soluble but acid-insoluble layer and the polysilicon layer 123 and the tunnel oxide layer 122 corresponding to the emitter regions 110 with alkali may comprise removing the alkali-soluble but acid-insoluble layer with a first alkali liquor, followed by removing the polysilicon layer 123 and the tunnel oxide layer 122 corresponding to the emitter regions 110 with a second alkali liquor, wherein the alkalinity of the first alkali liquor is less than that of the second alkali liquor.

In the above technical solution, the removal of alkali-soluble but acid-insoluble layer is carried out in a separate step from the removal of the polysilicon layer 123 and the tunnel oxide layer 122, which facilitates the treatment in separate tanks, that is, the removal of the alkali-soluble but acid-insoluble layer is conducted in a tank that is dedicated to the removal of the alkali-soluble but acid-insoluble layer, and the removal of the polysilicon layer 123 and the tunnel oxide layer 122 is conducted in a tank that is dedicated to the removal of the polysilicon layer 123 and the tunnel oxide layer 122, which can effectively improve the situation of cross contamination between tanks.

In some exemplary embodiments, the steps of electrically connecting the positive electrode 131 to the emitter 111 and electrically connecting the negative electrode 141 to the back surface field 121 may include: providing an emitter contact hole 132 in the emitter 111 and printing a positive electrode 131 on an area corresponding to the emitter contact hole 132; and providing a back surface field contact hole 142 in the back surface field 121 and printing a negative electrode 141 on an area corresponding to the back surface field contact hole. Of course, in embodiments where other functional layers are provided on the back of the substrate 101, the emitter contact hole 132 and the back surface field contact hole 142 also run through the corresponding functional layers.

It is to be understood that in the method of preparing the solar cell 100 provided in the present application, further functional layers can be added in accordance with what is well known in the art, and the corresponding functional layers can be set in accordance with what is well known in the art.

In conventional preparation methods, one surface of the substrate 101 is usually textured prior to boron diffusion and the textured surface is used as the front surface of the substrate 101. This kind of preparation method tends to cause some damage to the textured surface in subsequent processes such as etching and corrosion, thus affecting the anti-reflection effect of the textured surface.

In some exemplary embodiments, using a second surface of the substrate 101 as the front surface of the substrate 101, the step of forming anti-reflection textured structure 150 on a surface of the substrate 101 may comprise: after the step of removing the alkali-soluble but acid-insoluble layer and the polysilicon layer 123 and the tunnel oxide layer 122 corresponding to the emitter regions 110 with alkali, and before the step of removing the remaining phosphosilicate glass and borosilicate glass on the back surface of the substrate 101 with acid, removing the phosphosilicate glass and borosilicate glass on the front surface of the substrate 101 with acid, and then texturing the front surface of the substrate 101 to form an anti-reflection textured structure 150.

In the above technical solution, the texturing step is carried out after the N-type and P-type areas have been prepared, which effectively reduces the damage to the anti-reflection textured structure 150 from the previous processes. Also, the texturing step is carried out before the removal of the remaining phosphorosilicate glass and borosilicate glass on the back of the substrate 101, so that the remaining phosphorosilicate glass and borosilicate glass on the back of the substrate 101 can be served as a mask, effectively preventing damage to the N-type and P-type areas from the texturing step. Of course, in other embodiments, it is also possible to texture the substrate 101 prior to the boron diffusion step.

Based on the consideration of setting other functional layers, an example of a method of preparing the solar cell 100 is given below, comprising the following steps.

Figure 5:
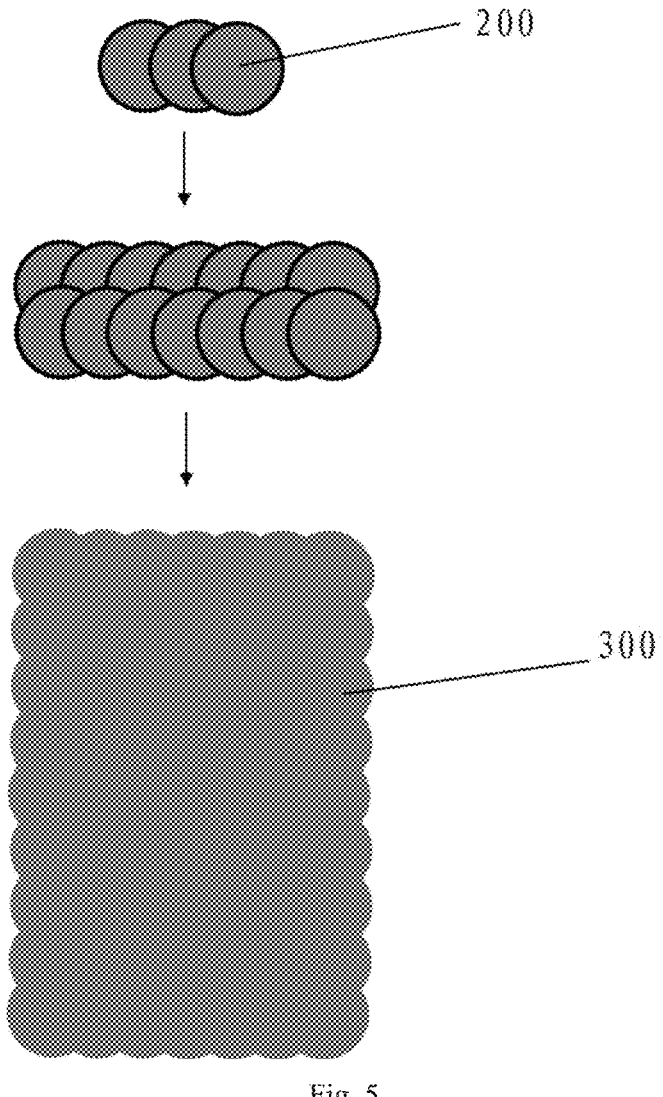
FIG. 5 illustrates a schematic diagram of laser slotting in the preparation method of the solar cell provided by an embodiment of the present application.

A. providing an N-type square monocrystalline silicon wafer as a substrate 101, and polishing a surface of the substrate 101 to remove mechanical damage;

B. conducting a boron diffusion on both sides of the silicon wafer to form a boron diffusion layer and a borosilicate glass on a surface of the boron diffusion layer on each side of the substrate 101; optionally, the boron diffusion having a square resistance of 120 to 150 $\Omega$/sq, for example, but not limited to, any one of or in a range between any two of 120 $\Omega$/sq, 130 $\Omega$/sq, 140 $\Omega$/s and 150 $\Omega$/sq;

C. retaining the borosilicate glass generated in the boron diffusion process, and conducting laser slotting on partial area of the borosilicate glass on one side of the substrate 101 obtained in step B; therein, see FIG. 5, laser slotting is achieved by moving light spot 200 to cover the entire slotting area;

D. etching off the boron diffusion layer in the slotted regions obtained in step C to form back surface field regions 120, areas without being slotted and etched being emitter regions 110, and the remaining boron diffusion layer in the emitter regions 110 being emitters 111;

E. growing a tunnel oxide layer 122 on the back of the substrate 101 obtained in step D and then depositing an intrinsic amorphous silicon layer, wherein, exemplarily, the PECVD (plasma enhanced chemical vapor deposition) method is used, which, compared with the conventional LPCVD (low pressure chemical vapor deposition) method, is less expensive, has a shorter process time and less winding plating, and facilitates the control of appearance and yield rate.

F. conducting a phosphorus diffusion on the substrate 101 obtained in step E to cause the intrinsic amorphous silicon layer to form a polysilicon layer 123 made of phosphorus doped polysilicon and to generate a phosphosilicate glass on a surface of the polysilicon layer 123, and achieving an N-type doping on the polysilicon layer 123 corresponding to the back surface field regions 120 to form back surface fields 121 corresponding to the back surface field regions 120;

G. printing the corrosion resistant slurry on the back of the substrate 101 with printed lines corresponding to the laser slotted region 300 obtained in step C, that is, printed lines being on the surface of the phosphosilicate glass corresponding to the back surface field region 120 formed in step D;

H. drying the corrosion resistant slurry printed in step G to form an alkali-soluble but acid-insoluble layer.

I. removing the phosphosilicate glass generated by the phosphorus diffusion in step F, wherein, since the phosphosilicate glass in the back surface field regions 120 is protected from removal by the alkali-soluble but acid-insoluble layer, this step is used to remove the phosphosilicate glass corresponding to the emitter regions 110;

J. removing the alkali-soluble but acid-insoluble layer printed in step G with alkali.

K. removing the tunnel oxide layer 122 and the polysilicon layer 123 on the back grown in steps E and F, wherein, this step is used to remove the polysilicon layer 123 and the tunnel oxide layer 122 corresponding to the emitter regions 110 since the polysilicon layer 123 and the tunnel oxide layer 122 in the back field regions 120 are protected from removal by the phosphosilicate glass retained in step I;

L. removing the phosphosilicate glass and borosilicate glass on the front surface generated due to diffusion in steps B and F respectively;

M. retaining the remaining phosphosilicate glass and the borosilicate glass on the back generated by diffusion in steps B and F, respectively, as back masks, and texturing the front surface of the substrate 101 using a texturing solution to form an anti-reflection textured structure 150;

N. removing the phosphosilicate glass and the borosilicate glass on the back of the substrate 101 and chemically cleaning the substrate 101, the remaining boron diffusion layer in the emitter regions 110 serving as the emitters 111, and the remaining tunnel oxide layer 122 and the polysilicon layer 123 in the back surface field regions 120 serving as the back surface fields 121;

O. plating silicon nitride anti-reflection layer 160 on the anti-reflection textured structure 150 formed in step M;

P. sequentially depositing an aluminum oxide passivation layer 170 and a silicon nitride passivation layer 180 on the back of the substrate 101;

Q. performing laser hole opening on the remaining emitters 111 and back surface fields 121 of step N to form emitter contact holes 132 and back surface field contact holes 142, respectively;

R. printing corresponding metal positive electrodes 131 and negative electrodes 141 in the laser hole opening area obtained in step Q;

S. printing insulating adhesive on the back to prevent short circuiting between the positive electrode 131 and the negative electrode 141; and T. printing metal positive electrode 131 bus bar and metal negative electrode 141 bus bar on the back.

The features and properties of this application are described in further detail below in connection with the examples.

Example 1

A method of preparing a solar cell 100 as shown in FIG. 1 may comprise:

A. providing an N-type square monocrystalline silicon wafer as a substrate 101, and polishing a surface of the substrate 101 with a 20% KOH solution to remove mechanical damage;

B. performing boron diffusion on both sides of the silicon wafer to form a boron diffusion layer and a borosilicate glass on a surface of the boron diffusion layer on each side of the substrate 101;

Wherein the square resistance is 120 $\Omega$/sq;

C. retaining the borosilicate glass generated by the boron diffusion process, and conducting laser slotting on partial area of the borosilicate glass on one side of the substrate 101 obtained in step B;

wherein the width of the slotted region in the first predetermined direction a is 200 $\mu$m and the distance between two adjacent slotted regions is 1200 $\mu$m;

D. etching off the boron diffusion layer in the slotted regions in step C to form back surface field regions 120; areas without being slotted and etched being emitter regions 110, and the remaining boron diffusion layer in the emitter regions 110 being emitters 111;

E. growing a tunnel oxide layer 122 on the back of the substrate 101 obtained in step D using PECVD method, followed by depositing an intrinsic amorphous silicon layer;

Wherein the tunnel oxide layer 122 has a thickness of 1 nm and the intrinsic amorphous silicon layer has a thickness of 200 nm;

F. performing a phosphorus diffusion on the substrate 101 obtained in step E to cause the intrinsic amorphous silicon layer to form a polysilicon layer 123 made of phosphorus doped polysilicon and to generate a phosphosilicate glass on a surface of the polysilicon layer 123, and achieving an N-type doping on the polysilicon layer 123 corresponding to the back surface field regions 120 to form back surface fields 121 corresponding to the back surface field regions 120;

Wherein the square resistance is 30 $\Omega$/sq;

G. printing a corrosion resistant slurry on the back of the substrate 101 with printed lines corresponding to the laser slotted regions 300 obtained in step C, that is, printed lines being on the surface of the phosphosilicate glass corresponding to the back surface field regions 120 formed in step D;

H. drying the corrosion resistant slurry printed in step G to form an alkali-soluble but acid-insoluble layer, wherein the alkali-soluble but acid-insoluble layer has a line width of 100 μm in the first predetermined direction a;

I. removing the phosphosilicate glass generated by the phosphorus diffusion in step F with a 10% chain HF solution, wherein, since the phosphosilicate glass in the back surface field regions 120 is protected from removal by the alkali-soluble but acid-insoluble layer, this step is used to remove the phosphosilicate glass corresponding to the emitter regions 110;

J. removing the alkali-soluble but acid-insoluble layer printed in step G with a 5% KOH solution;

K. removing the tunnel oxide layer 122 and the polysilicon layer 123 on the back grown in steps E and F with a 10% KOH solution, wherein, this step is used to remove the polysilicon layer 123 and the tunnel oxide layer 122 corresponding to the emitter regions 110 since the polysilicon layer 123 and the tunnel oxide layer 122 in the back field regions 120 are protected from removal by the phosphosilicate glass retained in step I;

L. removing the phosphosilicate glass and borosilicate glass on the front surface respectively generated due to diffusions in steps B and F with a 10% chain HF solution;

M. retaining the remaining phosphosilicate glass and the borosilicate glass on the back generated by diffusions in steps B and F, respectively, as back masks, and texturing the front surface of the substrate 101 using a texturing solution to form an anti-reflection textured structure 150;

N. removing the phosphosilicate glass and the borosilicate glass on the back of the substrate 101 with a 10% chain HF solution and chemically cleaning the substrate 101, the remaining boron diffusion layer in the emitter regions 110 serving as the emitters 111, and the remaining tunnel oxide layer 122 and the polysilicon layer 123 in the back surface field regions 120 serving as the back surface fields 121;

O. plating a silicon nitride anti-reflection layer 160 on the anti-reflection textured structure 150 formed in step M by using PECVD method, the silicon nitride anti-reflection layer 160 having a thickness of 80 nm;

P. sequentially depositing an aluminum oxide passivation layer 170 and a silicon nitride passivation layer 180 on the back of the substrate 101 by using PECVD method, wherein the aluminum oxide passivation layer 170 has a thickness of 10 nm, and the silicon nitride passivation layer 180 has a thickness of 75 nm;

Q. performing laser hole opening on the remaining emitters 111 and back surface fields 121 of step N to form emitter contact holes 132 and back surface field contact holes 142, respectively;

Wherein, three rows of emitter contact holes 132 are distributed in each emitter 111, the emitter contact hole 132 having a diameter of 25 μm; in the first predetermined direction a, the spacing between centers of two adjacent emitter contact holes 132 in each emitter 111 is 40 μm; in the second predetermined direction b, the spacing between centers of two adjacent emitter contact holes 132 in each emitter 111 is 60 μm;

And wherein, in each back surface field 121 are distributed 2 rows of back surface field contact holes 142, the diameter of the back surface field contact holes 142 being 30 μm; in the first predetermined direction a, the spacing between centers of two adjacent back surface field contact holes 142 in each back surface field 121 is 40 μm; in the second predetermined direction b, the spacing between centers of two adjacent back surface field contact holes 142 in each back surface field 121 is 60 μm;

R. printing corresponding metal positive electrodes 131 and negative electrodes 141 in the laser hole opening area obtained in step Q, and then drying at 200° C.;

S. printing insulating adhesive on the back to prevent short circuiting between the positive electrode 131 and the negative electrode 141, followed by drying at 200° C.; and T. printing metal positive electrode 131 bus bar and metal negative electrode 141 bus bar on the back, and finally, sintering in a sintering furnace at 700° C.

The electrical properties of the solar cell 100 obtained in Example 1 were tested, and the results show that the photoelectric conversion efficiency is up to 23.83%, the open circuit voltage Voc is up to 700 mV, the current density Jsc is up to 42.02 mA/cm² and the fill factor FF is up to 81%.

Example 2

It differs from Example 1 in that:

The following step is added to steps N and O: performing a shallow phosphorus diffusion to form a front surface field 190, which results in a solar cell 100 with the structure shown in FIG. 4.

In Example 2, a front surface field 190 is formed, creating a minority carrier potential energy difference at the surface, blocking the movement of minority carriers towards the high recombination surface and thus reducing the recombination of electron-hole pairs at the front surface.

The electrical performance of the solar cell 100 made in Example 2 was tested, and the results show that, the photoelectric conversion efficiency is up to 24%, the open circuit voltage Voc is up to 704 mV, the current density Jsc is up to 42.05 mA/cm² and the fill factor FF is up to 81.07%.

Example 3

It differs from Example 1 in that:

In the first predetermined direction a, the width of the slotted region is 250 μm and the spacing between two adjacent slotted regions is 1400 μm.

Three rows of emitter contact holes 132 are distributed in each emitter 111, the emitter contact hole 132 having a diameter of 30 μm; in the first predetermined direction a, the spacing between centers of two adjacent emitter contact holes 132 in each emitter 111 is 50 μm; and in the second predetermined direction b, the spacing between centers of two adjacent emitter contact holes 132 in each emitter 111 is 80 μm.

2 rows of back surface field contact holes 142 are distributed in each back surface field 121, and the diameter of the back surface field contact hole 142 is 32 μm; in the first predetermined direction a, the spacing between centers of two adjacent back surface field contact holes 142 in each back surface field 121 is 50 μm; and in the second predetermined direction b, the spacing between centers of two adjacent back surface field contact holes 142 in each back surface field 121 is 80 μm.

In the present example, it is possible to ensure a sufficiently small metallized area while increasing the width of the subsequent printing alignment and thus reducing the difficulty of printing.

The electrical performance of the solar cell 100 produced in Example 3 was tested, and the results show that, the photoelectric conversion efficiency is up to 23.81%, the open circuit voltage Voc is up to 700.2 mV, the current density Jsc is up to 41.96 mA/cm², and the fill factor FF is up to 81.03%.

Example 4

It differs from Example 1 in that:

The KOH solution used in the polishing, texturing and etching processes can be replaced by NaOH solution to save costs.

The electrical performance of the solar cell 100 produced in Example 4 was tested: the photoelectric conversion efficiency is up to 23.86%, the open circuit voltage Voc is up to 700.5 mV, the current density Jsc is up to 42.03 mA/cm², and the fill factor FF is up to 81.05%.

Example 5

It differs from Example 1 in that:

The square resistance of the boron diffusion in step B is 150 Ω/sq.

The spacing between two adjacent slotted regions in the first predetermined direction a is 1000 μm.

In this example, the design of high resistance dense grid lines is able to reduce the recombination of the emitters on the back while ensuring metal contact, and boost the open circuit voltage of the solar cell.

The electrical performance of the solar cell 100 made in Example 5 was tested: the photoelectric conversion efficiency is up to 23.98%, the open circuit voltage Voc is up to 703.4 mV, the current density Jsc is up to 42.07 mA/cm², and the fill factor FF is up to 81.03%.

Example 6

It differs from Example 1 in that:

In step P, the aluminum oxide passivation layer 170 can be prepared by means of depositing ALD (atomic layer deposition) to a thickness of 7 nm.

In this example, compared with the aluminum oxide passivation layer 170 deposited by PECVD, the aluminum oxide passivation layer 170 deposited in the present example is more electronegative and denser, which can improve the back passivation effect of the solar cell, thereby improving the open circuit voltage and photoelectric conversion efficiency of the solar cell.

The electrical performance of the solar cell 100 produced in Example 6 was tested: the photoelectric conversion efficiency is up to 24.02%, the open circuit voltage Voc is up to 703.2 mV, the current density Jsc is up to 42.10 mA/cm², and the fill factor FF is up to 81.15%.

The above is only preferred examples of the present application and is not intended to limit the present application, and for those skilled in the art, the present application can be subject to various modifications and variations. Any modification, equivalent substitutions, improvements, etc. made within the spirit and principles of this application shall be included within the scope of protection of the present application.

INDUSTRIAL PRACTICALITY

The present application provides a solar cell and a method of preparing the same, which belongs to the field of photovoltaic technology. The solar cell includes a substrate having alternating emitter regions and back surface field regions on a back of the substrate. The emitter regions are provided with emitters made of boron doped monocrystalline silicon. The back field regions are provided with back fields; the back field comprises a tunnel oxide layer and a polysilicon layer laminated arranged, the material of the polysilicon layer being phosphorus doped polysilicon, the tunnel oxide layer being located between the polysilicon layer and the polysilicon layer. The positive electrode of the solar cell is electrically connected to the emitter, and the negative electrode of the solar cell is electrically connected to the back surface field. The preparation method of the solar cell is used to achieve the preparation of the solar cell of the above structure. The solar cell can increase the frontal light receiving area on the front surface and reduce the recombination rate of electron-hole pairs, thus being able to effectively increase the photoelectric conversion efficiency of the solar cell.

Furthermore, it would be understood that the solar cell of the present application and the method of preparing the same are reproducible and can be used in a variety of industrial applications. For example, the solar cell of the present application and the method of preparing the same can be used in the field of photovoltaic technology.

The invention claimed is:

1. A method of preparing a solar cell, comprising:
   conducting a boron diffusion on a substrate to form a boron diffusion layer on a surface of the substrate and a borosilicate glass on a surface of the boron diffusion layer;
   using a first surface of the substrate as a back of the substrate, and sequentially conducting laser slotting and boron diffusion layer etching on partial area of the borosilicate glass on the back of the substrate to form back surface field regions, areas without being slotted and etched being emitter regions, and the emitter regions and the back surface field regions being configured to alternate on the back of the substrate;

growing a tunnel oxide layer on the back of the substrate, followed by depositing an intrinsic amorphous silicon layer;

conducting a phosphorus diffusion on the substrate, so as to cause the intrinsic amorphous silicon layer to form a polysilicon layer made of phosphorus doped polysilicon and create a phosphosilicate glass on the surface of the polysilicon layer;

printing a corrosion resistant slurry being soluble in alkali but insoluble in acid on a surface of the phosphosilicate glass corresponding to the back surface field regions and drying the corrosion resistant slurry to form an alkali-soluble but acid-insoluble layer;

removing the phosphosilicate glass corresponding to the emitter regions with acid;

removing the alkali-soluble but acid-insoluble layer and the polysilicon layer and the tunnel oxide layer corresponding to the emitter regions with alkali;

removing the remaining phosphorosilicate glass and borosilicate glass on the back of the substrate with acid;

using the remaining boron diffusion layer in the emitter regions as emitters, and using the remaining tunnel oxide layer and polysilicon layer in the back surface field regions as back surface fields; and electrically connecting a positive electrode to the emitter and electrically connecting a negative electrode to the back surface field.

2. The method according to claim 1, wherein the removing the alkali-soluble but acid-insoluble layer and the polysilicon layer and the tunnel oxide layer corresponding to the emitter regions with alkali comprises:

removing the alkali-soluble but acid-insoluble layer with a first alkali liquor, followed by removing the polysilicon layer and the tunnel oxide layer corresponding to the emitter regions with a second alkali liquor;

wherein an alkalinity of the first alkali liquor is less than the alkalinity of the second alkali liquor.

3. The method according to claim 1, wherein the electrically connecting a positive electrode to the emitter and electrically connecting a negative electrode to the back surface field comprises:

providing emitter contact holes in the emitters, and printing positive electrodes at regions corresponding to the emitter contact holes; and providing back surface field contact holes in the back surface fields, and printing negative electrodes at regions corresponding to the back surface field contact holes.

4. The method according to claim 1, further comprising using a second surface of the substrate as a front surface of the substrate and providing an anti-reflection structure on the surface of the substrate, the using a second surface of the substrate as a front surface of the substrate and providing an anti-reflection structure on the surface of the substrate including:

after the step of removing the alkali-soluble but acid-insoluble layer and the polysilicon layer and the tunnel oxide layer corresponding to the emitter regions with alkali, and before the step of removing the remaining phosphosilicate glass and borosilicate glass on the back of the substrate with acid, removing the phosphosilicate glass and the borosilicate glass on the front surface of the substrate with acid, and then texturing the front surface of the substrate to form the anti-reflection textured structure.

5. The method according to claim 3, further comprising:

distributing the emitter regions and the back surface field regions side by side along a first predetermined direction;

in the first predetermined direction, each of the back surface field regions has a dimension of 100 to 300 μm, and a spacing between two adjacent back surface field regions is from 600 μm to 1500 μm.

6. The method according to claim 5, wherein in the first predetermined direction, the positive electrode has a dimension of 50 to 200 μm, and the negative electrode has a dimension of 40 to 100 μm.

7. The method according to claim 3, wherein the positive electrode is electrically connected to an inner wall of the emitter contact hole provided in the emitter and the negative electrode is electrically connected to an inner wall of the back surface field contact hole provided in the back surface field; the emitter contact hole and the back surface field contact hole each having a diameter of 25 to 50 μm.

8. The method according to claim 5, wherein in the first predetermined direction, a spacing between centers of two adjacent emitter contact holes in each emitter is 20 to 80 μm, and a spacing between centers of two adjacent back surface field contact holes in each back surface is 20 to 80 μm.

9. The method according to claim 5, wherein each of the emitter regions and the back surface field regions extends along a second predetermined direction, the second predetermined direction being perpendicular to the first predetermined direction; in the second predetermined direction, a spacing between centers of two adjacent emitter contact holes in each emitter is 50 to 100 μm apart, and a spacing between centers of two adjacent back surface field contact holes in each back surface is 20 to 80 μm.

10. The method according to claim 3, further comprising:

alternatively arranging the emitters and the back surface fields, so that the emitter contact holes and the back surface field contact holes are alternated arranged.

11. The method according to claim 3, wherein in each emitter region, the emitter contact holes are provided in at least one row, wherein a plurality of emitter contact holes in each row of emitter contact holes are spaced along a second predetermined direction, and multiple rows of emitter contact holes are spaced along a first predetermined direction; in each back surface field region, the back surface field contact holes are provided in at least one row, wherein a plurality of back surface field contact holes in each row of back surface field contact holes are spaced along a second predetermined direction, and multiple rows of back surface field contact holes are spaced along a first predetermined direction.

12. The method according to claim 1, wherein the tunnel oxide layer is a silicon dioxide film and has a thickness of 1 to 5 nm.

13. The method according to claim 1, wherein the polysilicon layer has a thickness of 100 to 500 nm.

14. The method according to claim 4, further comprising:

providing a silicon nitride anti-reflection layer on a surface of the anti-reflection textured structure of the front surface of the substrate;

providing an aluminum oxide passivation layer on surfaces of the emitters and the back surface fields; and providing a silicon nitride passivation layer on a surface of the aluminum oxide passivation layer;

wherein, the positive electrode is electrically connected to the emitter after penetrating the silicon nitride passivation layer and the aluminum oxide passivation layer, and the negative electrode is electrically connected to the back surface field after penetrating the silicon nitride passivation layer and the aluminum oxide passivation layer.

15. The method according to claim 14, wherein the silicon nitride anti-reflection layer has a thickness of 80 to 120 nm; the aluminum oxide passivation layer has a thickness of 3 to 20 nm; the silicon nitride passivation layer has a thickness of 75 to 150 nm.

16. The method according to claim 14, further comprising:

further forming a front surface field on a surface of the anti-reflection textured structure by shallow phosphorus diffusion, the front surface field being located between the anti-reflection textured structure and the silicon nitride anti-reflection layer.

17. The method according to claim 1, further comprising:

providing a positive electrode bus bar and a negative electrode bus bar spaced arranged;

wherein, the positive electrode bus bar is electrically connected to each positive electrode and the negative electrode bus bar is electrically connected to each negative electrode; the positive electrode bus bar is spaced from the negative electrode with insulating adhesive and the negative electrode bus bar is spaced from the positive electrode with insulating adhesive.

18. The method according to claim 17, wherein the positive electrode and the negative electrode both extend in a third predetermined direction, the positive electrode bus bar and the negative electrode bus bar extending in a direction perpendicular to the direction along which the positive electrode extends, and the negative electrode bus bar extending in a direction perpendicular to the direction along which the negative electrode extends.

\* \* \* \* \*